United States Patent [19]

Kuwano et al.

[11] Patent Number: 4,855,214

[45] Date of Patent: Aug. 8, 1989

[54] RADIATION-SENSITIVE HIGH-POLYMERIC MATERIAL

[75] Inventors: Yukinori Kuwano, Katano; Yoshikazu Tsujino, Sakai; Yuji Hamada, Hirakata, all of Japan

[73] Assignee: Sanyo Electric Co., Ltd., Osaka, Japan

[21] Appl. No.: 90,992

[22] Filed: Aug. 31, 1987

[30] Foreign Application Priority Data

Sep. 1, 1986 [JP] Japan .................. 61-205283
Jun. 9, 1987 [JP] Japan .................. 62-144430

[51] Int. Cl.$^4$ .................. G03C 1/495; G03C 1/68
[52] U.S. Cl. .................. 430/281; 430/270; 430/296; 430/326; 430/942
[58] Field of Search .............. 430/270, 296, 966, 967, 430/942, 281, 326

[56] References Cited

FOREIGN PATENT DOCUMENTS 0118776  9/1979  Japan .
0162430 10/1982  Japan .
 163233 10/1982  Japan .
  82241  5/1983  Japan .

Primary Examiner—Paul R. Michl
Assistant Examiner—Christopher D. RoDee
Attorney, Agent, or Firm—Armstrong, Nikaido, Marmelstein, Kubovcik & Murray

[57] ABSTRACT

There is disclosed a radiation sensitive high polymeric material which is used, for example, for making a photomask which is comprising polymethyl methacrylate having an average molecular weight which is in a range from 600,000 to 1,500,000 and a tetraalkylammonium perchlorate as an orientation inhibitor wherein said polymethyl methacrylate and tetraalkylammonium perchlorate are dissolved in an acetic cellosolve as a solvent.

4 Claims, 1 Drawing Sheet

RADIATION-SENSITIVE HIGH-POLYMERIC MATERIAL

BACKGROUND OF THE INVENTION

1. Field of the Invention

The present invention is related to a radiation-sensitive high-polymeric material of positive type suitable for forming micro-patterns upon manufacturing semiconductor devices such as LSIs (large scale integrated circuits).

2. Description of the Prior Art

It has been well known that radiation-sensitive materials of some kinds show such a property that portions thereof having been irradiated by radioactive rays such as electron beams, X-rays, $\gamma$-rays, $\alpha$-rays, ionic-rays or the like become soluble in developer. This property has been utilized for forming micro or fine patterns of semiconductor devices such as LSIs.

Generally speaking, radiation-sensitive materials of positive type as resists used on forming micro patterns are required to have good properties in sensitivity, resolution, resistivity against etching, ease of application, ease of filtering and stability.

Although there has been known polymethyl methacrylate (hereinafter referred to as PMMA), polybutene-1-sulphone or the like as a radiation-sensitive material to be used, these materials have relatively low sensitivity in general. Even PMMA having a low sensitivity of an order of $10^{-4}$ C/cm$^2$ is considered to satisfy the properties mentioned above. Accordingly, it is needed to increase the irradiation of the radioactive rays, otherwise it takes a long time to form micro-patterns.

These micro-patterns are formed usually with use of a difference between solubilities of irradiated and non-irradiated portions against a developer, which is caused due to a difference between molecular weights of the two portions. However, when a film of PMMA applied on a substrate is heated to dry, every molecule of PMMA is oriented in one direction and, due to this, there is not caused a sufficient difference in the solubility against the developer between portions irradiated by radioactive rays and portions not irradiated. Consequently, it becomes difficult to form clear micro-patterns. In other words, the sensitivity of the film to radioactive rays is lowered by heating thereof and in order to form micro patterns clearly, much more radioactive rays and/or a longer radiation time are required. However, this lowers the through put in the production of such devices. Thus, radiation-sensitive materials having a higher sensitivity are demanded.

One might consider increasing the molecular weight of PMMA in the initial state (namely, before exposure to radioactive rays) in order to enhance the sensitivity thereof since it helps make the difference in the solubility large.

However, this causes such disadvantages that it becomes difficult to apply a film with a uniform thickness and to remove contaminations since the ease of application and ease of filtering thereof are lowered thereby.

In JP-A (Japanese Patent Laid Open Publication) No. 82241/1983, there is proposed a radiation-sensitive material having a high sensitivity which is improved by adding a halogenated compound of alkyl ammonium to PMMA represented by the formula R$_4$NX (R means an alkyl group and X means a halogen atom). The radiation sensitivity thereof is improved to a degree of $5 \times 10^{-6}$ C/cm$^2$, but it is not sufficient for practical use.

Further, in JP-A No. 163233/1982, there is proposed a radiation-sensitive material having a radiation sensitivity of a degree of $1 \times 10^{-6}$ C/cm$^2$ in which tetraalkyl ammonium perchlorate selected from among halogenated compounds of alkyl ammonium is added to PMMA. However, this material is inferior because ease of filtering depends on a molecular weight thereof and, therefore, contaminants cannot be removed. Further, it is not suitable for practical use because it is difficult to form a film having a uniform thickness due to the quick drying property of methyl ethyl ketone used as a solvent for PMMA.

SUMMARY OF THE INVENTION

An essential object of the present invention is to provide a radiation-sensitive polymeric material having a high radiation sensitivity, easiness of filtering and excellent ease of application and suitability for practical use.

Another object of the present invention is to provide a photo-mask for forming micro-patterns having excellent quality.

In order to accomplish these objects, according to the present invention, there is provided a radiation-sensitive high-polymeric material of positive type comprising PMMA having a weight average molecular weight which is in a range from 600,000 to 1,500,000 and a tetraalkylammonium perchlorate as an orientation inhibitor wherein the PMMA and tetraalkylammonium perchlorate are dissolved in a cellosolve acetate as a solvent.

BRIEF DESCRIPTION OF THE DRAWINGS

These and other objects and features of the present invention will be more apparent when the preferred embodiment of the present invention is described in detail with reference of accompanied drawing.

DESCRIPTION OF THE PREFERRED EMBODIMENT

Figure 1:
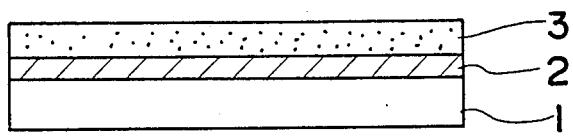
FIGS. 1(A), 1(B), 1(C), 1(D) and 1(E) are schematic sectional views showing the process for making a photo-mask with use of a radiation-sensitive material according to the present invention.
Figure 1:
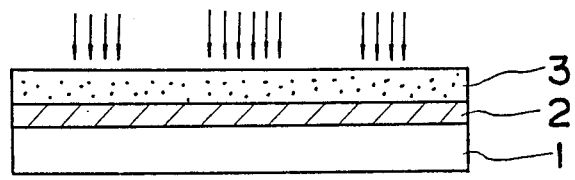
Figure 1:
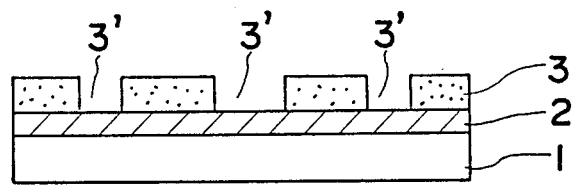
Figure 1:
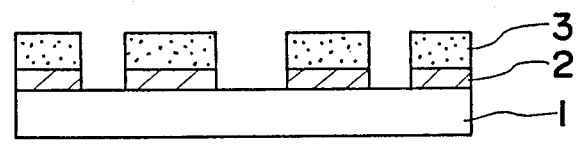
Figure 1:
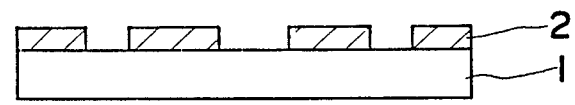

Radiation-sensitive high-polymeric material according to the present invention comprises PMMA having a weight average molecular weight falling within a range from 600,000 to 1,500,000 and tetraalkylammonium perchlorate as an orientation inhibitor which is represented by a formula R$_4$NClO$_4$, wherein R is an alkyl group such as C$_3$H$_7$— or C$_4$H$_9$—. Said PMMA and tetraalkylammonium perchlorate are solved in a cellosolve acetate (that is, ethylene glycol monoloweralkyl ether acetate) such as ethyl cellosolve acetate or methyl cellosolve acetate as a solvent.

The radiation-sensitive material according to the present invention is applied on a surface of a substrate and is heated up over the glass transition point. During this heating process, molecules of PMMA are inhibited from orienting in a specific direction by tetraalkylammonium perchlorate contained therein, in other words, PMMA is brought into an amorphous state thereby, whereas PMMA in a prior-art material was oriented in a specific direction upon heating process. Accordingly, the solubility in the developer thereof increases and a difference in the rate of solution between irradiated portions and non-irradiated ones becomes larger, and the sensitivity to radiation rays is enhanced.

According to the present invention, there is used PMMA having a weight average molecular weight and a solvent. Table 2 shows respective properties estimated.

TABLE 2

| KIND | REPRESENTATIVE SOLVENT | SOLUBILTIY OF PMMA | SOLUBILITY OF TnBAP | FLATNESS OF FILM | BOILING POINT (°C.) |
|---|---|---|---|---|---|
| cellosolve | methyl cellosolve | Δ | ◯ | Δ | 124 |
|  | ethyl cellosolve | Δ | ◯ | Δ | 135 |
| cellosolve acetate | methyl cellosolve acetate | ⊙ | ⊙ | ⊙ | 143 |
|  | ethyl cellosolve acetate | ◯ | ⊙ | ◯ | 156 |
| acetic ester | ethyl acetate | Δ | ◯ | X | 77 |
| ketone | methyl ethyl ketone | ⊙ | ⊙ | X | 80 |
|  | methyl isobutyl ketone | Δ | ◯ | ·Δ | 116 |
| alkyl halide | tetrachloroethane | ⊙ | ⊙ | Δ | 129 |
| heterocyclic compound | tetrahydrofuran | Δ | ◯ | X | 60 |
| aromatic compound | toluene | Δ | X | X | 111 |
| aliphatic compound | cyclohexane | X | X | — | 81 | which falls in a range from 600,000 to 1,500,000. If it is smaller than 600,000, irradiated portions are apt to solve easily and the effect of an orientation inhibitor is cancelled thereby. This lowers the sensitivity to radiation rays.

On the other hand, if it is larger than 1,500,000, filtering of PMMA with use of a filter having a radius of mesh 0.2 μm or less becomes difficult.

Tetra-n-butyl ammonium perchlorate (hereinafter referred to as TnBAP) as an orientation inhibitor is contained at a rate of 15 weight % to PMMA. The rate of TnBAP to PMMA can be increased up to approximately 20 weight %. In this case, the relation is shown in TABLE 1 between the molecular weight of PMMA and the sensitivity (amount of exposure) necessary for forming micro patterns is shown in Table 1.

TABLE 1

| Molecular Weight | Sensitivity (C/cm$^2$) |
|---|---|
| 600,000 | $3.2 \times 10^{-6}$ |
| 1,050,000 | $1.2 \times 10^{-6}$ |
| 1,200,000 | $1.0 \times 10^{-6}$ |
| 1,500,000 | $0.8 \times 10^{-6}$ |

Namely, if the molecular weight is smaller than 600,000, the sensitivity thereof has a value considerably larger than $1.0 \times 10^{-6}$ C/cm$^2$, which is not considered to be satisfactorily high.

PMMA has such a tendency that the sensitivity becomes higher as the molecular weight thereof increased and, unfortunately, the flatness of film applied becomes worse because the viscosity thereof increases. On the contrary, if the average molecular weight exceeds 1,500,000, it becomes difficult to filter it with use of a filter having a radius of mesh smaller than 0.2 μm and, therefore, it becomes impossible to remove contaminants contained therein.

A solvent for PMMA must have a good solubility to PMMA having a molecular weight within range from 600,000 to 1,500,000, excellent solubility to the orientation inhibitor, uniform flatness of film applied which is closely related to the ease of application and a relatively slower rate of drying.

Properties of respective solutions each of which is obtained with use of PMMA having an average molecular weight of 1,050,000, TnBAP as orientation inhibitor and a solvent. Table 2 shows respective properties estimated.

Wherein ⊙, ◯, Δ and X represent "excellent", "fair", "inferior" and "bad", respectively. The boiling point of each solvent is closely related to drying rate and, if it is low, the solution obtained has a high drying speed since vaporizing pressure thereof becomes high. On the contrary, if it is high, the solution obtained has a low drying rate due to low vaporizing pressure of the solvent. However, if it is too high, it takes a long time to dry PMMA and/or to solve PMMA. Accordingly, the boiling point of about 140° C. is desirable for obtaining a reasonable drying rate.

As is apparent from Table 2, a cellosolve acetate is the most suitable for a solvent which is able to dissolve PMMA and TnBAP very easily and shows excellent flatness, though it depends upon viscosity and/or boiling point thereof. The reason why the flatness is affected by the boiling point is that there is a possibility that a solution of PMMA in a solvent having a low boiling point has been dried into a solid state (or a state close to solid state) on a substrate before it is spread out by centrifugal force so as to have a uniform thickness thereon in a case wherein it is applied onto the center portion of the substrate rotated in a horizontal plane.

Next, an example according to the present invention will be explained.

First, TnBAP of 5.70 g as an orientation inhibitor is mixed with PMMA of 38 g having an average molecular weight of 1,050,000±100,000 and , then, they are dissolved into methyl cellosolve acetate of 100 ml as a solvent so as to obtain a radiation-sensitive high-polymeric material according to the present invention. The viscosity of this material obtained is 50 CP at a temperature of 20° C. The reason why methyl cellosolve acetate is used is that it is an excellent solvent for both PMMA and TnBAP and has an excellent easiness of application since the vapor pressure thereof is relatively low. However, it is to be noted that the solvent used in the present invention is not limited to methyl cellosolve acetate.

The radiation-sensitive material thus obtained is filtered with use of a filter having a diameter of mesh of 0.2 μm such as Fluarex-filter ® produced by Millipore Inc. under a pressure of 0.4 kg/cm$^2$ and all amount thereof has been filtered in about 30 minutes. Namely, it shows an excellent filtering property.

Next, a method for manufacturing a photo-mask with use of the radiation-sensitive material according to the present invention will be explained referring to FIGS. 1(A) through 1(E).

At first, as shown in FIG. 1(A), said radiation sensitive material 3 according to the present invention is applied onto a chromium layer 2 deposited on a substrate of glass 1 which is rotated about the center thereof at rate of 750 r.p.m. and, then, heat treatment (pre-bake) at 180° C. is carried out for 60 minutes. During this heat treatment, molecules of PMMA are not oriented due to the existence of the orientation inhibitor as mentioned above. The film of PMMA obtained has thickness of 5,100 ($\pm$100) Å and shows an excellent easiness of application.

Thereafter, an electron beam having a line width of 0.75 μm and an exposure amount of $1.2 \times 10^{-6}$ C/cm$^2$ is irradiated on the film 3 so as to scan a predetermined pattern, as is shown in FIG. 1(B).

Next, the film 3 is developed at 22° C. for eight minutes with a developer which is a mixture of methyl cellosolve and isopropyl alcohol mixed at a volume ratio of 8 to 2 in order to remove exposed (irradiated) portions, as shown in FIG. 1(C).

After the film is post-baked for stabilizing it, portions of chromium layer 2 exposed from apertures 3' having been formed by said development are removed by etching, as shown in FIG. 1(D).

Then, the radiation-sensitive material 3 remained on chromium layer 2 is removed with use of O$_2$ plasma, as shown in FIG. 1(E) and, thus, a photo-mask is obtained finally.

The photo-mask thus obtained has a line width of pattern of 0.75 μm. This indicates that the radiation-sensitive material according to the present invention shows a high resistance against an etchant and has a high resolution of image.

The preferred embodiment described herein is illustrative and not restrictive, the scope of the invention being indicated by the appended claims and all variations which come within the meanings of the claims are intended to be embraced herein.

What is claimed is:

1. A radiation-sensitive high-polymeric material comprising:
   polymethyl methacrylate having an average molecular weight which is in a range from 600,000 to 1,500,000 and a tetraalkylammonium perchlorate as an orientation inhibitor wherein said polymethyl methacrylate and tetraalkylammonium perchlorate are dissolved in an ethylene glycol monoloweralkyl ether acetate as a solvent.

2. A radiation-sensitive high polymeric material according to claim 1, in which said tetraalkylammonium perchlorate is tetra-n-butylammonium perchlorate.

3. The radiation sensitive high-polymeric material of claim 1 wherein said solvent is methyl cellosolve acetate.

4. The radiation sensitive high-polymeric material of claim 2 wherein said solvent is methyl cellosolve acetate.